United States Patent [19]

Clark

[11] Patent Number: 5,153,591
[45] Date of Patent: Oct. 6, 1992

[54] METHOD AND APPARATUS FOR ENCODING, DECODING AND TRANSMITTING DATA IN COMPRESSED FORM

[75] Inventor: Alan D. Clark, Ipswich, England

[73] Assignee: British Telecommunications public limited company, United Kingdom

[21] Appl. No.: 623,809

[22] PCT Filed: Jul. 4, 1989

[86] PCT No.: PCT/GB89/00752
§ 371 Date: Dec. 27, 1990
§ 102(e) Date: Dec. 27, 1990

[87] PCT Pub. No.: WO90/00837
PCT Pub. Date: Jan. 25, 1990

[30] Foreign Application Priority Data

Jul. 5, 1988 [GB] United Kingdom ............... 8815978

[51] Int. Cl.$^5$ .............................................. H03M 7/38
[52] U.S. Cl. ........................................ 341/51; 341/67; 341/79
[58] Field of Search ............... 341/51, 65, 67, 79, 341/87

[56] References Cited

U.S. PATENT DOCUMENTS

| | | |
|---|---|---|
| 4,464,650 | 8/1984 | Eastman et al. |
| 4,906,991 | 3/1990 | Fiala et al. ............... 341/51 |
| 4,990,910 | 2/1991 | Takishima et al. ........ 341/67 |
| 5,003,307 | 3/1991 | Whiting et al. ........... 341/51 |

FOREIGN PATENT DOCUMENTS

| | | |
|---|---|---|
| 8127815 | 12/1984 | European Pat. Off. |
| 0148008 | 7/1985 | European Pat. Off. |
| WO86/00479 | 1/1986 | European Pat. Off. |

OTHER PUBLICATIONS

*IBM Technical Disclosure Bulletin*, vol. 14, No. 11, Apr. 1972, Koch, "Representation of Tree Data Structures for Manipulation and Search Operation Data", pp. 3521–3522.

*IBM Technical Disclosure Bulletin*, vol. 20, No. 8, Jan. 1978, Winterbottom, "General Purpose Database Structure", pp. 3320–3323.

*IBM Technical Disclosure Bulletin*, vol. 25, No. 11B, Apr. 1983, Crus et al, "Method for Deleting Records from a Hierarchical Data Base", pp. 5886–5888.

Primary Examiner—Marc Hoff
Attorney, Agent, or Firm—Nixon & Vanderhye

[57] ABSTRACT

Data compression and decompression utilizing, e.g., the Ziv-Lempel algorithm is simplified by utilizing a tree structure for the dictionary in which alternative symbols at a given position in a symbol sequence (a,b,c) are linked by linking pointers R of a first type and successive symbols (ab,bc,ca,aba,abb,abc) are linked by linking pointers D of a second type. For example, the sequence ab may continue with any one of the symbols a,b, and c grouped together by R pointers in a list below the final symbol of the sequence ab. Each symbol is defined by an associated pair of D and R pointers, in conjunction with a parent pointer P which identifies its parent. Symbols having no D pointers extending therefrom are pruned from the tree and transferred to a free list as shown in FIG. 8(b).

68 Claims, 12 Drawing Sheets

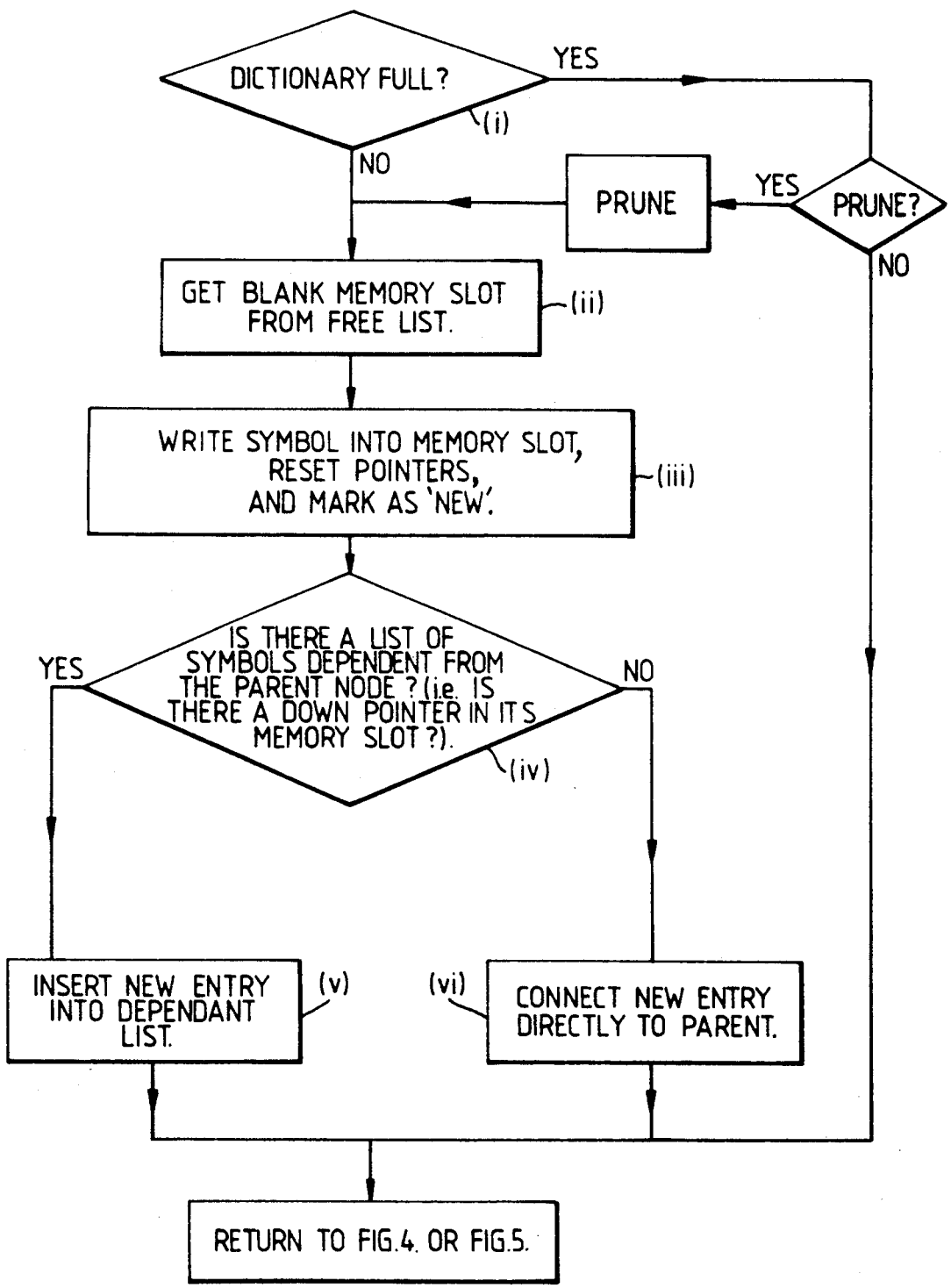

Fig. 13.

| INDEX | CHARACTER | D | R | P | LFU POINTER | LENGTH INDEX |
|---|---|---|---|---|---|---|
| 0<br>1<br>2<br>3<br>⋮<br>N−1 | BASIC SOURCE SYMBOL SET | | | | <u>OR</u><br>FREQUENCY COUNT | |
| N<br>N+1<br>⋮<br>N+M−1 | CONTROL SYMBOLS | | | | | |
| N+M<br>⋮<br>END | STRINGS | | | | | |

OPTIONS (LFU POINTER, LENGTH INDEX)

METHOD AND APPARATUS FOR ENCODING, DECODING AND TRANSMITTING DATA IN COMPRESSED FORM

FIELD OF THE INVENTION

The present invention relates to methods and apparatus for compressing data, methods and apparatus for decoding the compressed data, a method of transmitting data and data processing apparatus utilising compressed data. The above methods and apparatus all utilise an adaptive string encoding technique which involves a dictionary having a search tree and means for maintaining this search tree. The invention is applicable particularly but not exclusively to adaptive string encoding utilising the Ziv-Lempel algorithm. The basic form of this algorithm is described in IEEE Transactions IT-23, May 3rd 1977 pp337-343 "A Universal Algorithm for Sequential Data Compression"—J. Ziv and A. Lempel.

BACKGROUND OF THE INVENTION

The basic Ziv-Lempel encoder has a dictionary, in which each entry has an associated index number. Initially the dictionary contains only the basic alphabet of the source. During the encoding process, new dictionary entries are formed by appending single symbols to existing entries. The dictionary may be considered to be in the form of a search tree of connected symbols of the source alphabet. Nodes in the tree correspond to specific sequences of symbols which begin at the root of the tree and the data is compressed by recognising strings of symbols in the uncompressed input data which correspond to nodes in the tree, and transmitting the index of the memory location corresponding to the matched node. A corresponding search tree is provided in the decoder which receives the index representing the compressed data and the reverse process is performed by the decoder to recover the compressed data in its original form. The search tree of the encoder gradually grows during the encoding process as further strings of symbols are identified in the input data and in order to enable the decoder to decode the compressed data, its search tree must be updated to correspond with the search tree of the encoder.

The Ziv-Lempel algorithm has been found difficult to implement in practice, since it requires an indefinitely large memory to store the search tree in its basic form. The use of data structures such as the "trie" structure disclosed by Sussenguth (ACM Sort Symposium 1962) can however greatly improve the storage efficiency and search time associated with text strings. EPA127,815 (Miller and Wegman) and EPA129439 (Welch) disclose similar implementations of the Ziv Lempel algorithm based on the use of a trie structure.

In EPA127,815 (Miller and Wegman) improvements are described to the Ziv-Lempel algorithm which enhance the memory efficiency and speed up the encoding process. The dictionary is held in the form of a tree, with each node containing a single character and a pointer to the parent node which represents the prefix string. A hash table is used to determine, given a matched sub-string and the next input character, whether the extended sub-string is in the dictionary. However, the hash table requires a significant amount of memory and processing time in addition to that needed for the storage of the basic tree structure used to encode the dictionary.

EPA129,439 (Welch) discloses a high speed data compression and decompression apparatus and method in which strings of symbols in the input message are recognised and stored. Strings are entered into a string table and are searched for in the string table by means of a hashing function which utilises a hash key comprising a prior code signal and an extension character to provide a set of N hash table addresses where N is typically 1 to 4. The N RAM locations are sequentially searched and if the item is not in the N locations, it is considered not to be in the table. This procedure is stated to reduce compression efficiency but to simplify substantially the implementation.

U.S. Pat. No. 4,612,532 (Bacon et al) discloses a system, not based on the Ziv-Lempel algorithm, for the dynamic encoding of a stream of characters in which each character is associated with a "follow set" table of characters which usually follow it, in order of the frequency with which they occur. These tables are of a pre-determined length and therefore the degree of branching of the tree is inevitably restricted.

U.S. Pat. No. 4,464,650 (Eastman et al) discloses a method based on the Ziv-Lempel algorithm of compressing input data comprising feeding successive symbols of the data into a processor provided with a memory, generating from strings of symbols in the input data a dictionary in the form of a search tree of symbols in the memory which has paths representative of said strings, matching symbol strings in the input data with previously stored paths in the search tree and generating from the stored paths compressed output data corresponding to the input data. However the data structure utilised for the circuitry is highly complex and furthermore a hashing function is required.

A particular problem inherent in the implementation of an encoder of the type described occurs when the search tree grows to the limit of the memory space available. It is necessary to reduce the size of (i.e. "prune") the search tree in order to recover memory space for the storage of new strings. A number of well known methods exist for performing this type of function, which are reviewed in Computer Architecture and Parallel Processing (Hwang and Briggs, McGraw Hill 1985). The commonly used techniques are LRU—Least Recently Used, applied to the Ziv Lempel algorithm by Miller and Wegman (EPA127815), LFU—Least Frequently Used, applied to a similar string encoding algorithm by Mayne and James (Information Compression by Factorising Common strings, Computer Journal, 18,2 pp 157-160, 1975), FIFO—First In First Out, LIFO—Last In First Out, the CLOCK algorithm, and Random replacement, the last four techniques cited have not been applied to the Ziv Lempel algorithm. In addition, it is known to reset the search tree back to the initial state which bears a penalty in terms of compression performance, and also to cease adding new strings when the memory capacity is exhausted which will give poor performance if the characteristics of the data change.

SUMMARY OF THE INVENTION

An object of the present invention is to provide an improvement with regard to these prior art techniques. Accordingly in one aspect the invention provides a method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence: characterised in that when the memory is full, sequential indexed memory locations of the search tree are tested and deleted if they contain a node of the search tree which does not have a linking pointer of the second type pointing to another node and the resulting freed memory locations are made available for new dictionary entries.

In the abovementioned one aspect, the testing and deletions of indexed memory locations of the search tree corresponds to the deletion of some or all of those strings represented by the tree that do not form prefixes of other strings. This feature enables highly complex search trees to be stored in memories of limited size and provides a useful simplification in comparison with the arrangements of U.S. Pat. No. 4,464,650 (Eastman et al) and EPA 127,815 (Miller and Wegman).

U.S. Pat. No. 4,464,650 also discloses a corresponding method of decoding compressed data comprising feeding successive symbols of the data into a processor provided with a memory, storing in the memory a dictionary in the form of a search tree of symbols, and utilising the search tree to translate the compressed data to decoded data.

In another aspect, the invention provides a method of decoding compressed data which has been compressed by a method in accordance with the abovementioned one aspect of the present invention, comprising reading successive characters of the compressed data with a processor provided with a memory, storing in the memory a dictionary in the form of a search tree of symbols which is built up from the compressed data, and utilising the search tree to translate the compressed data to decoded data, stored symbols in the search tree being linked by linking pointers of two distinct types; a pointer of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols: characterised in that when the memory is full, sequential indexed memory locations of the search tree are tested and deleted if they contain a node of the search tree which does not have a linking pointer of the second type pointing to another node and the resulting freed memory locations are made available for new dictionary entries.

U.S. Pat. No. 4,464,650 also discloses an encoder for compressing input data comprising a processor capable of receiving successive symbols of input data, a memory, means for storing in the memory a search tree of symbols which has paths representative of strings of symbols in the input data, and means for matching symbol strings in the input data with previously stored paths in the search tree and for generating from the stored paths compressed output data corresponding to the input data.

In another aspect the invention provides an encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence: characterised in that, in use, the processor is arranged to determine when the memory is full, to test sequential indexed memory locations of the search tree, to delete a memory location if it contains a node of the search tree which does not have a linking pointer of the second type pointing to another node and to make the resulting freed memory locations available for new dictionary entries.

U.S. Pat. No. 4,464,650 also discloses a decoder for decoding compressed data comprising a processor capable of receiving successive symbols of compressed data, a memory and means for storing in the memory a dictionary in the form of a search tree of symbols, the processor being arranged to utilise the search tree to translate the compressed data to decoded data.

In another aspect, the invention provides a decoder for decoding compressed data comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols: characterised in that, in use, the processor is arranged to determine when the memory is full, to test sequential indexed memory locations of the search tree, to delete a memory location if it contains a node of the search tree which does not have a linking pointer of the second type pointing to another node and to make the resulting freed memory locations available for new dictionary entries.

Further preferred features of the invention are claimed in the dependent claims.

A further preferred feature which may be utilised in the present invention is described by Welch in the article "A Technique for High-Performance Data Compression" in Computer—June 1984 pp8–19. This article is incorporated herein by reference and describes a method of improving the initial performance of the Ziv-Lempel algorithm. Initially, the dictionary is almost empty and a small number of bits suffice to encode the symbol strings of the input data. As the dictionary grows, the code word size is increased up to a predetermined maximum. This improves performance during the first ten to 20 thousand symbols encoded, but at the cost of increased complexity.

BRIEF DESCRIPTION OF THE INVENTION

Embodiments of the invention are described below by way of example only with reference to FIGS. 1 to 13 of the accompanying drawings, of which:

FIG. 1b shows a list of free memory locations associated with the search tree structure of FIG. 1a.

FIG. 2b shows a list of free memory locations associated with the search tree structure of FIG. 2a.

FIG. 7 is a flow diagram showing an algorithm for updating the dictionary of the present invention;

FIG. 13 is a diagram showing the arrangement of the indexed memory locations of the memory.

DETAILED DESCRIPTION OF THE DRAWINGS

Figure 1A:
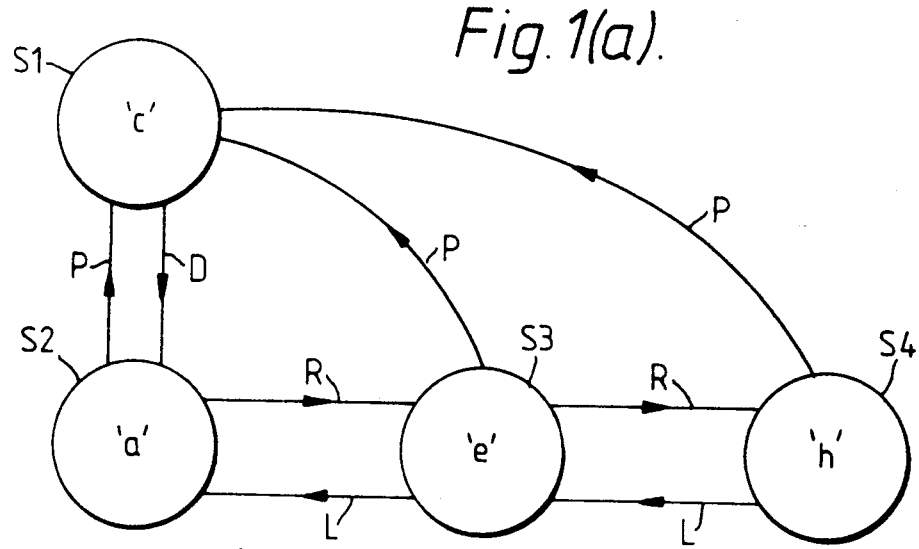
FIG. 1a shows one possible search tree structure for use in the invention.

Referring to FIG. 1a, the simplified search tree shown comprises a symbol S1 which may be followed by any one of three different symbols S2, S3 and S4. As an example, symbols S1 to S4 have been assigned the values 'c', 'a', 'e' and 'h', respectively, and the tree thus represents the four strings 'c', 'ca', 'ce' and 'ch'. Accordingly symbol S1 is linked to symbol S2 by a linking pointer "of the second type" as referred to herein above, namely a down pointer D. Since symbols S2, S3 and S4 are different possible symbols which may occur in a string in the input data after S1, they are linked by pointers "of the first type" as referred to herein above, namely right hand pointers R and left hand pointers L. Note that similar technology is used in the representation of binary trees (refer to, for example, "The Art of Computer Programming", Volume 1 and 3, by D. Knuth); this data structure is however being used to represent an m-ary search tree.

Figure 1B:
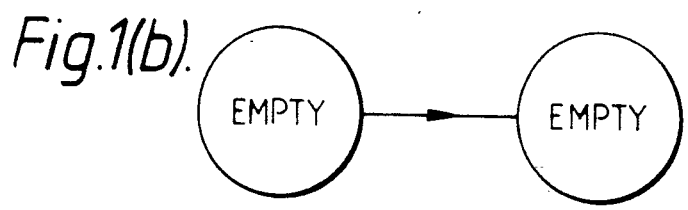

It is possible to search through the search tree from symbol S1 to any of symbols S2, S3 and S4 by using the linking pointers D and R and to search to the left of symbol S4 by following the left hand pointers L. In FIG. 1(b) two symbol locations are shown linked by a pointer and these constitute a list of free memory locations. This list is separate from the search tree but memory locations may be transferred between the free list and the search tree, the total memory capacity for symbols of the input data consisting of the memory locations in the search tree and the memory locations in the free list. In order to identify any of these symbols S1 to S4 it is necessary to know the "parent" of that symbol, namely the symbol connected to the immediately preceding down pointer D. This is indicated in each case by a parent indicator P for example, if the letter 'c' was stored as symbol S1, it would be the parent of S2, S3 and S4 and their parent indicators P would indicate the memory location of 'c'. In the embodiment of FIG. 1a, the parent indicators P are required in the search tree of the decoder only, and not in the search tree of the encoder. Otherwise the search trees of the encoder and decoder are identical.

The nodes within the search tree of which node S is a parent will be termed dependent nodes of S, or dependants of S. A dependent node of S represents a string constructed by appending a single character to the string represented by S. There can be as many dependent nodes of some node as exist symbols in the source alphabet.

Figure 2A:
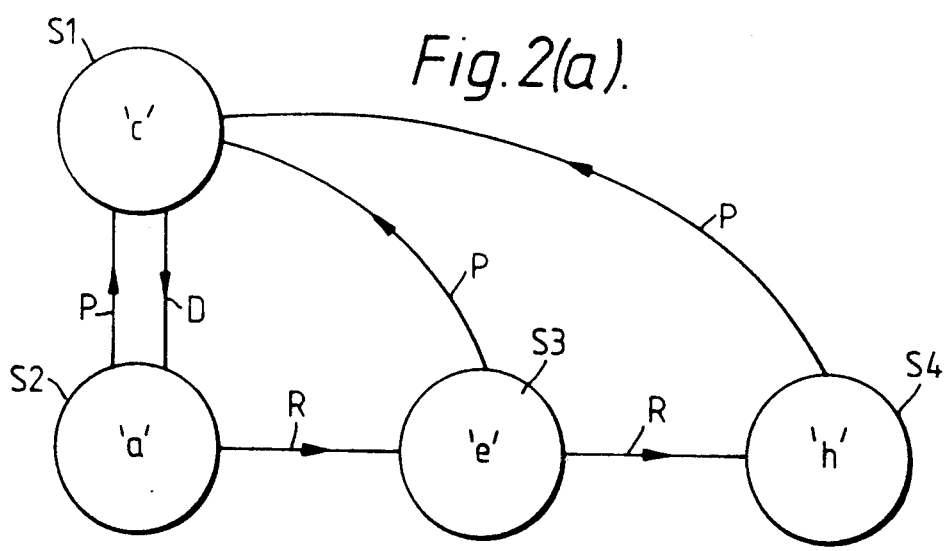
FIG. 2a shows another, preferred structure of a search tree for use in the invention.
Figure 2B:
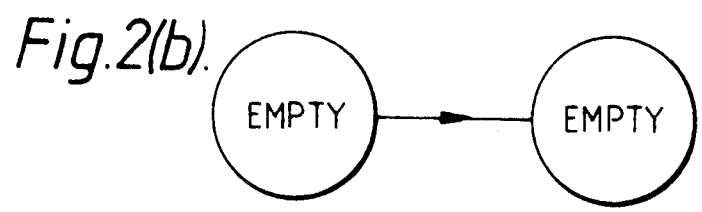

FIG. 2 shows a more preferred variant in which the left hand pointers L are dispensed with and the parent indicators P occur in the search tree of both the encoder and the decoder. Otherwise the search tree structure is identical to that shown in FIG. 1. Again a free list of symbol locations is maintained in the memory as shown in FIG. 2(b).

The dictionary or search tree will normally be initialised to include only the basic set of source symbols, subsequent entries or nodes representing strings of two or more symbols in length. In many practical applications it is desirable to provide additional symbols outside the normal source alphabet. These may represent for example a means for encoding repeated occurrences of a character (run length encoding) or indicating abnormal termination of the string matching process. (see FIG. 13).

The encoding of the sequence abcababcabc is described below with reference to FIG. 3 which shows the evolution of the search tree during the encoding process and also table I which shows the actual contents of the dictionary which represent the search tree shown in FIG. 3. As is shown below, the search tree is expanded by setting the pointers D R and P of dictionary entries 1 to M, the maximum permitted by the memory available.

TABLE I(a)

| Index | Symbol | D | R | P | String Represented |
|-------|--------|---|-----|---|--------------------|
| 1 | a | | (2) | | a |
| 2 | b | | (3) | | b |
| 3 | c | | | | c |

Figure 3A:
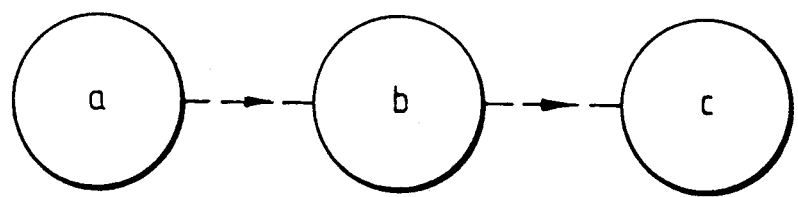
FIGS. 3a to 3f show sequential stages in the evolution of a search tree during a data compression process in accordance with the invention.
Figure 3B:
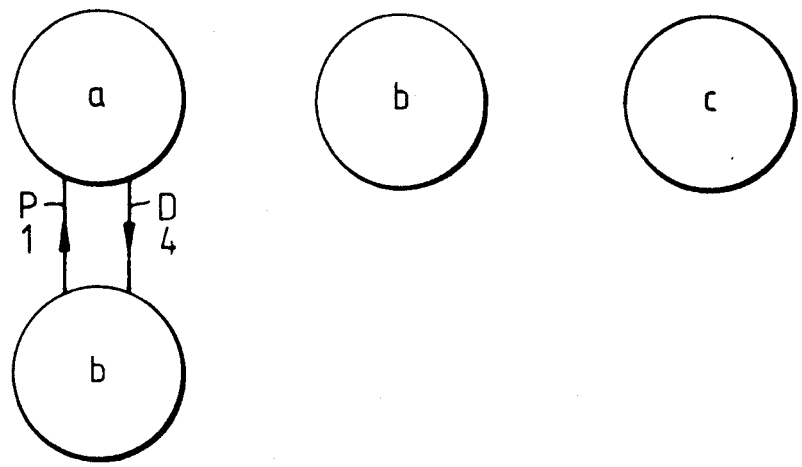
Figure 3C:
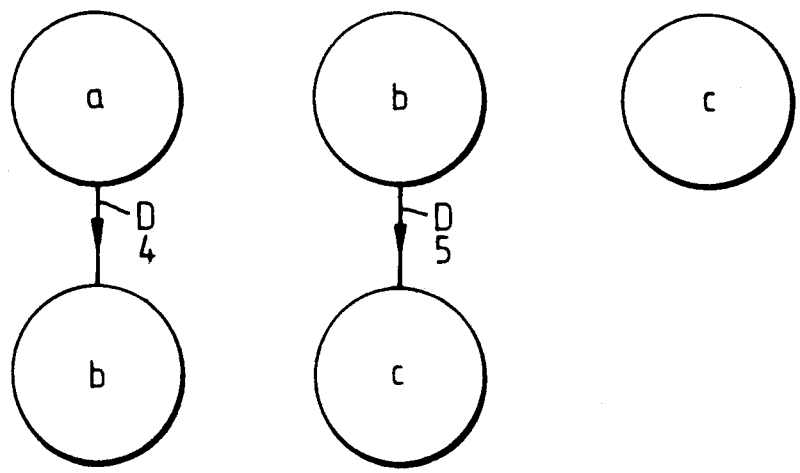
Figure 3D:
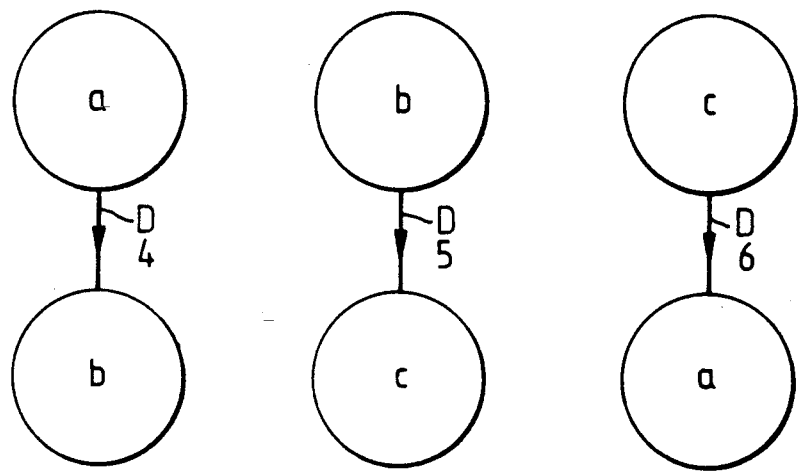

As shown in Table I(a) and FIG. 3(a) the dictionary initially contains only symbols a, b and c which are stored in dictionary entries 1, 2, and 3 respectively. They may be stored in a predetermined order and accordingly dictionary entry 1 is linked to dictionary entry 2 by a right hand linking pointer 2 which is located at dictionary entry 1 and dictionary entry 2 is linked to dictionary entry 3 by a right hand linking pointer 3 which is stored in dictionary entry 2. A preferred method is to equate the ordinal value of each symbol to its position in the table. Thus the set of N symbols would be assigned ordinal values in the range 0 to N−1 or 1 to N. This assignment may involve simply regarding the binary pattern representing the symbol as a number. These contents of the memory imply a structure as shown in FIG. 3(a).

In many applications only some of the possible symbols occur, in which case the first of these structures would be preferable. In those applications in which most of the possible symbols occur, the second method will reduce the initial character search time, accordingly the second method will be assumed below.

The first symbol of the sequence is input to the encoder, in this example 'a'. As the symbol represents the first character in a string the encoder uses the ordinal value of the character, in this example 1, to access directly the node within the search tree corresponding to the character. This node forms the root of a tree representing all strings known to the encoder that begin with the character.

The next symbol of the sequence is accepted by the encoder, and the D pointer of the current node used to locate the list of dependent nodes. The encoder would in general attempt to match the next symbol to one of those contained in the dependent nodes. If the attempt fails, as in this instance because node 1 does not yet have any dependants, a codeword representing the index of the current node/dictionary entry is transmitted, in this example some representation of the numeral 1. The unmatched symbol will be used to form the start of a new string.

The encoder is now able to add the string 'ab' to its search tree, in order that the string may be more efficiently encoded when encountered again. This is accomplished by creating a new node (entry) numbered 4 in this example, in the search tree (dictionary). The node contains the character, 'b', a D pointer to dependent nodes, initially set to null, an R pointer to other nodes in the list of dependents of the node's parent, in this instance set to null, and a pointer to the parent, set in this example to 1, as shown in Table I(b) and FIG. 3(b).

TABLE I(b)

| Index | Symbol | D | R | P | String Represented |
|---|---|---|---|---|---|
| 1 | a | 4 | | | a |
| 2 | b | | | | b |
| 3 | c | | | | c |
| 4 | b | | | 1 | ab |

The process is repeated, with 'b' used as the first character of a new string. The next symbol of the sequence is 'c' hence the encoder will attempt, using the process outlined above, to find the string 'bc' in the tree. This sequence is not yet known to the encoder, hence the index of the node representing the string 'b' will be communicated to the decoder, and the string 'bc' added to the search tree. The character 'c' is used to form the start of a new string. The updated dictionary is shown in Table I(c) and the corresponding search tree in FIG. 3(c).

TABLE I(c)

| Index | Symbol | D | R | P | String Represented |
|---|---|---|---|---|---|
| 1 | a | 4 | | | a |
| 2 | b | 5 | | | b |
| 3 | c | | | | c |
| 4 | b | | | 1 | ab |
| 5 | c | | | 2 | bc |

The next symbol 'a' is now read, being in this instance the fourth symbol in the sequence, and appended to the search string. The encoder now attempts to locate the string 'ca' in its dictionary. As this string is not yet present, the index of the dictionary entry corresponding to 'c' will be communicated to the decoder and the string 'ca', which may also be considered as an index-/character pair (3, 'a') added to its dictionary (search tree). This produces the dictionary shown in Table I(d) and search tree shown in FIG. 3(d). The unmatched character 'a' is used to start a new search string.

TABLE I(d)

| Index | Symbol | D | R | P | String Represented |
|---|---|---|---|---|---|
| 1 | a | 4 | | | a |
| 2 | b | 5 | | | b |
| 3 | c | 6 | | | c |
| 4 | b | | | 1 | ab |
| 5 | c | | | 2 | bc |
| 6 | a | | | 3 | ca |

The next symbol 'b' is now read and appended to the search string, forming the string 'ab'. The D pointer corresponding to 'a' is used to locate the list of 'a''s dependants; this pointer has the value 4 in this example. The encoder now searches for the last character in the search string amongst the list of dependants, using the R pointer. In this example the first dictionary entry examined, with index 4, contains the character 'b' and hence the encoder has matched the search string with a dictionary entry.

The next symbol 'a', being the sixth character in the input sequence, is read by the encoder and appended to the search string forming the string 'aba'. The encoder uses the D pointer of the last matched dictionary entry, numbered 4 in this example, to locate the list of dependants of the string 'ab'. As yet no dependants are known to the dictionary, hence the new string 'aba' or (4, 'a') is added to the dictionary, as shown in Table I(e) and FIG. 3(e). The index 4 is communicated to the decoder, and the unmatched character 'a' used to start a new search string.

TABLE I(e)

| Index | Symbol | D | R | P | String Represented |
|---|---|---|---|---|---|
| 1 | a | 4 | | | a |
| 2 | b | 5 | | | b |
| 3 | c | 6 | | | c |
| 4 | b | 7 | | 1 | ab |
| 5 | c | | | 2 | bc |
| 6 | a | | | 3 | ca |
| 7 | a | | | 4 | aba |

Figure 3E:
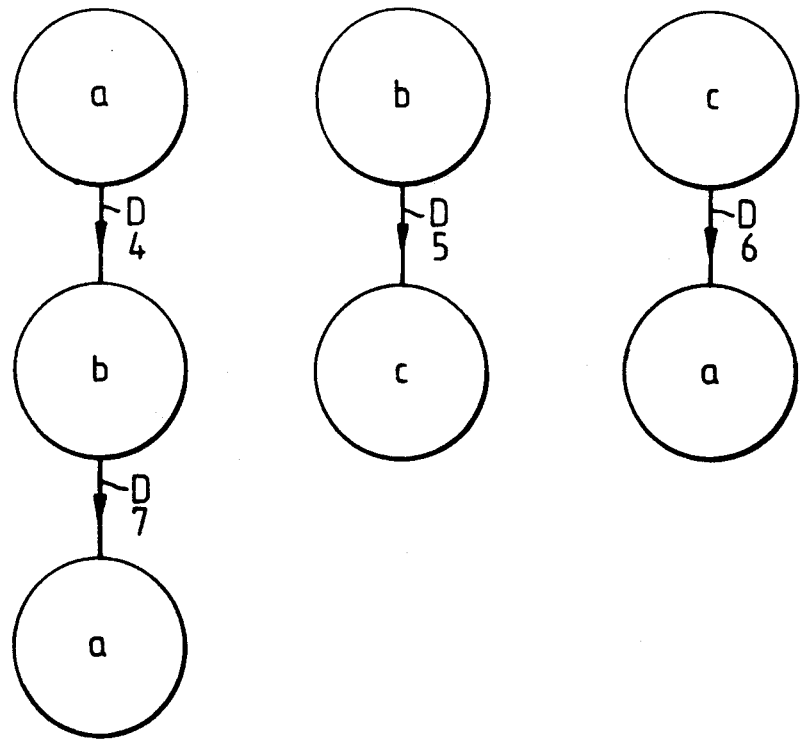
Figure 3F:
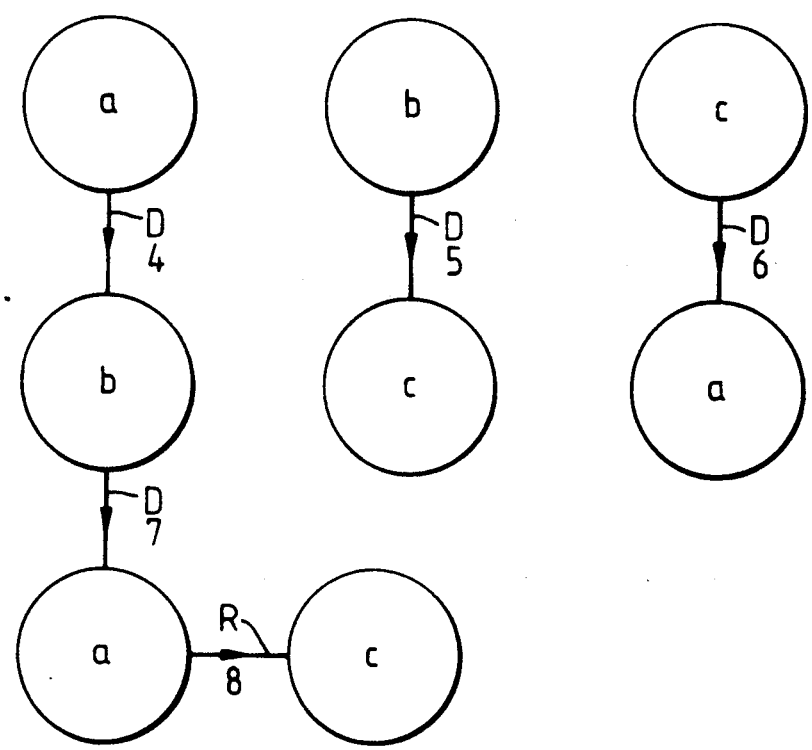

This corresponds to FIG. 3(e).

The encoder reads the next symbol and appends it to the search string, forming the new search string 'ab'. The encoder searches in the dictionary for this string, using the procedures outlined above, and matches it with dictionary entry 4. The next symbol 'c' is read and appended to the search string, forming 'abc'. The encoder attempts to locate this string, by searching through the dependant list of 'ab', but fails to find 'abc'. The index for 'ab', namely 4, is communicated to the decoder, and the new string (4, 'c') added to the dictionary as entry number 8, as shown in Table I(f) and FIG. 3(f).

TABLE I(f)

| Index | Symbol | D | R | P | String Represented |
|-------|--------|---|---|---|--------------------|
| 1 | a | 4 | | | a |
| 2 | b | 5 | | | b |
| 3 | c | 6 | | | c |
| 4 | b | 7 | | 1 | ab |
| 5 | c | | | 2 | bc |
| 6 | a | | | 3 | ca |
| 7 | a | | 8 | 4 | aba |
| 8 | c | | | 4 | abc |

During the next string encoding cycle the encoder would match the string 'ca' with entry 6 in the dictionary, and transmit 6 to the decoder, and add 'cab' or (6, 'b') to the dictionary. During the following cycle, the encoder would match the string 'bc' with entry 5 in the dictionary, and add (5, x) to the dictionary, where x is the character following the last in the sequence shown.

The sequence 'abcababcabc' would thus have been encoded using the list of index values 1234465, which provides a small degree of compression. If however the same sequence were encountered again by the encoder it would be encoded as 'abc' (dictionary entry 8), 'aba' (dictionary entry 7), 'bc' (dictionary entry 5), and 'abc' (dictionary entry 8), resulting in the transmitted sequence 8758. If the sequence of symbols occurred at least twelve times the encoder may represent it by a single index value, thereby obtaining a high degree of compression.

Figure 4:
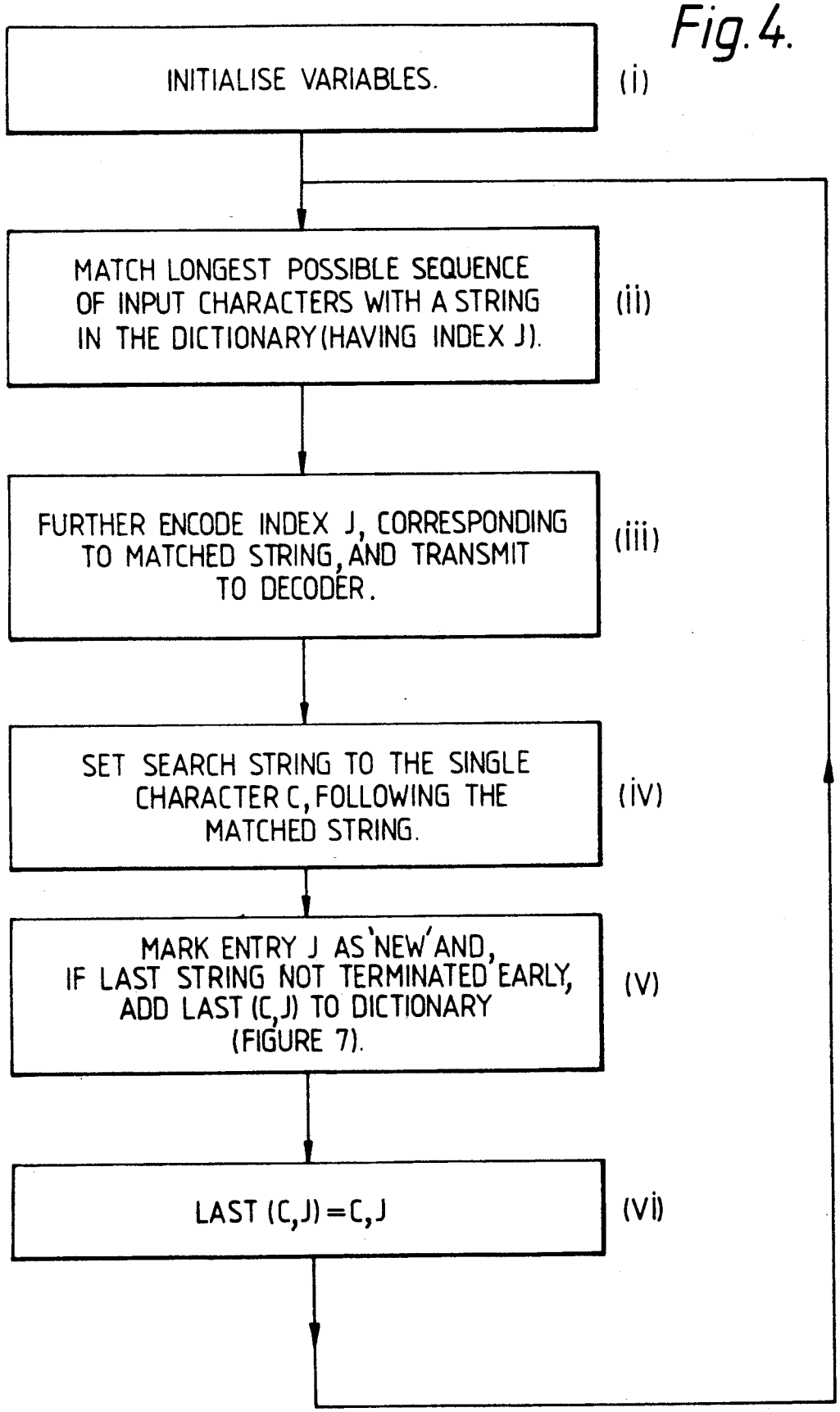
FIG. 4 is a general flow diagram of an encoding algorithm which is utilised in the invention.

The encoding algorithm is illustrated more formally in FIG. 4. In step i the variables are initialised and then, repeatedly, the longest possible sequence of characters in the input message is mapped onto a string of the search tree in step ii, for example the sequence bc at the end of the input message is mapped onto the string bc in FIG. 3(f). In step iii the index of the terminal node corresponding to the matched string (e.g. bc) or some further encoded representation thereof, is sent, and the search string set to the following character of the input message (step iv).

The process of string matching would normally be terminated when the string with the next character appended is not in the dictionary. There are however other instances in which string matching may be terminated exceptionally, for example if no character is received from the source within some specified time interval from the last character, or if the string length reaches some maximum beyond which a buffer limit may be exceeded, or if some specified time interval has occurred since the encoder began encoding the string. In the second of these examples the decoder could deduce that exceptional termination had occurred. In the first and third examples it is necessary for the encoder to transmit an indication, following transmission of the index representing the terminated string; this indication may be an additional control symbol outside the ordinal value range of the source alphabet, and would be encoded as a single codeword.

The index of the matched string and the next unmatched character must be added to the dictionary. If however, they are immediately added to the dictionary, the encoder could start using the new entry before the decoder has received sufficient information to construct an equivalent dictionary entry. Thus the previous index-/character pair are added to the dictionary (v) and the present index/character pair stored (vi). If the dictionary is full it may be processed to recover some storage space. The process of adding a new dictionary entry and recovering space are further described below. In order that the dictionary entry referenced by the stored index/character pair is not deleted before being used in the updating process, the dictionary entry is marked as 'new' using the procedure further described below.

Figure 5:
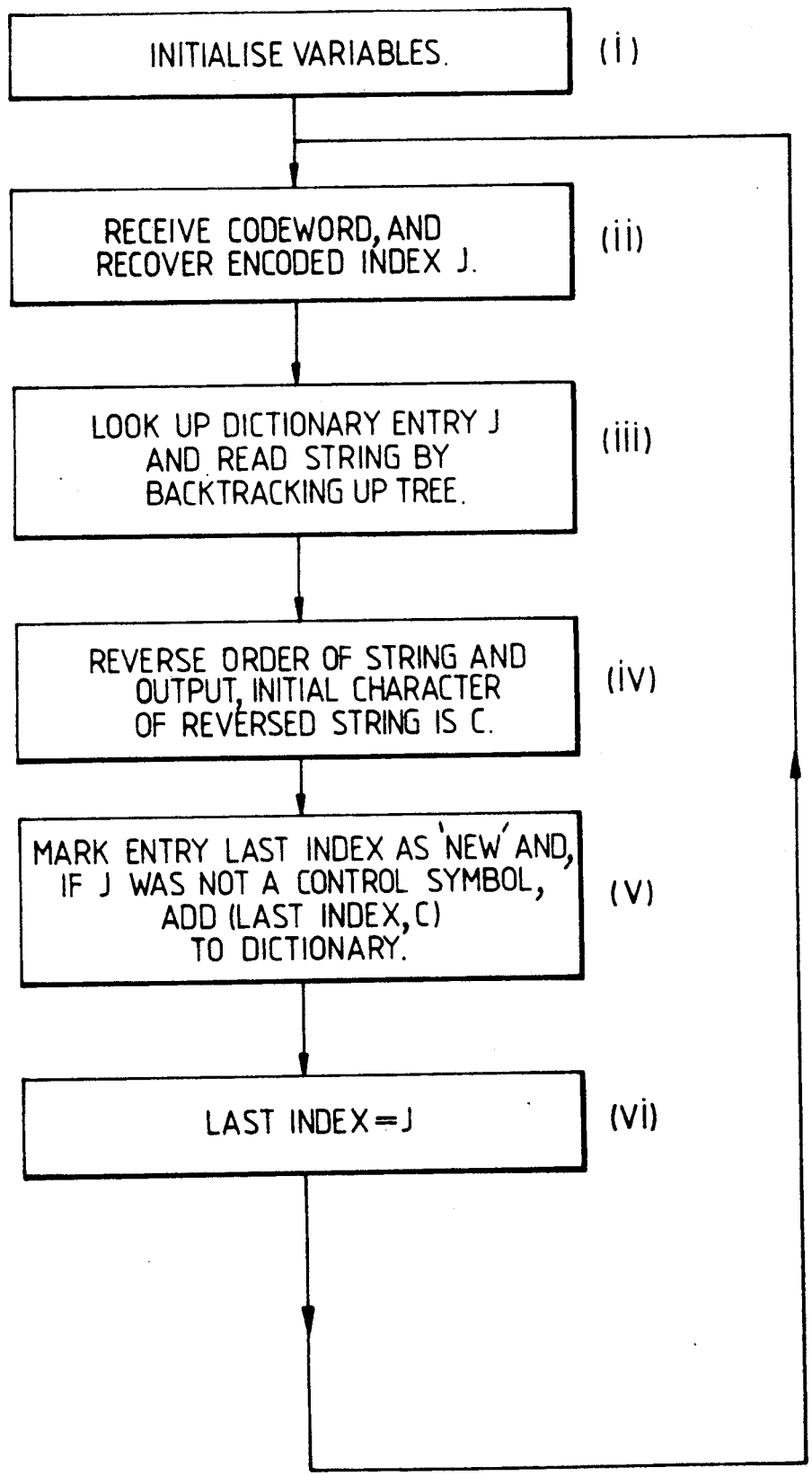
FIG. 5 is a general flow diagram of a decoding algorithm which is utilised in the present invention.

FIG. 5 shows the corresponding decoding algorithm. The variables are initialised in step i. A received codeword is initially decoded in step ii to recover the transmitted index, J, representing the encoded string. The value of J allows the decoder to access directly the dictionary entry corresponding to the encoded string. The tree is then re-traced from entry J back to the root of the string, and the string is read out in step iii. For example if the value 8 were received by a decoder having the search tree of FIG. 3(f) it would find the symbol c at the "leaf" of the tree at dictionary entry 8 and would re-trace the P pointers 7 and 4 to the root a and would therefore read out the sequence cba. This sequence is then reversed in the subsequent step iv to regenerate the original sequence abc and the decoder algorithm then proceeds to update the dictionary provided it is not inhibited by a control character in step v.

Figure 6:
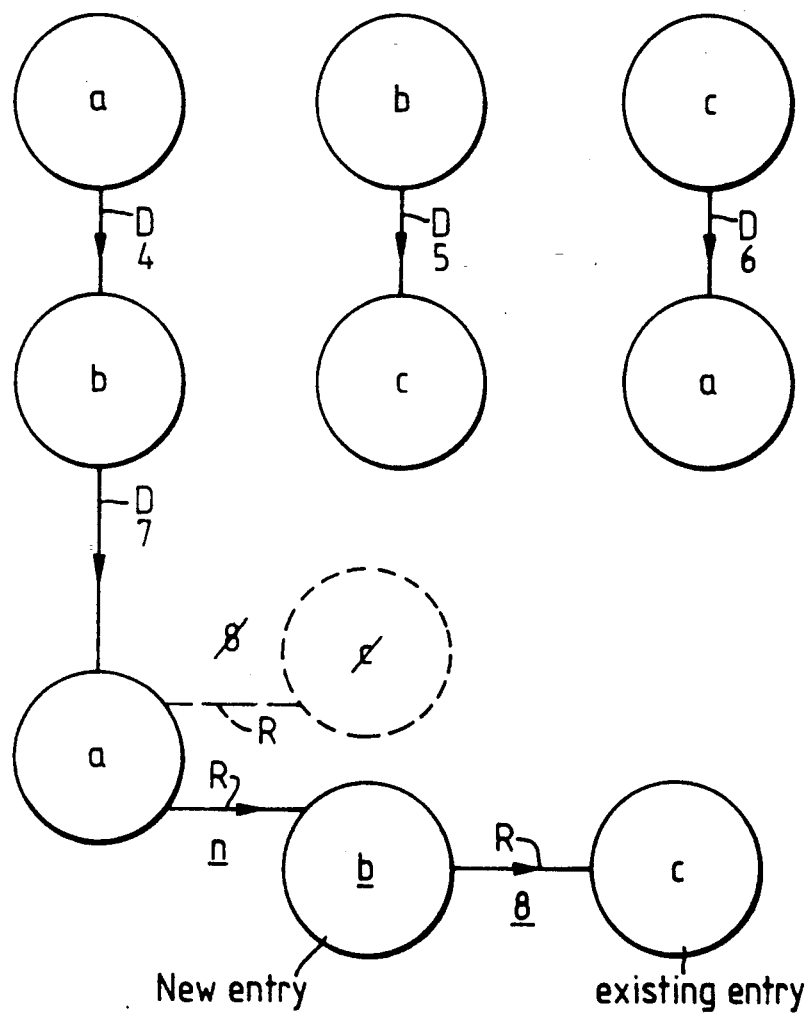
FIG. 6 is a diagram showing the insertion of a "leaf" of a search tree in a data compression process in accordance with the invention.

An example of updating the search tree is shown in FIG. 6 and the corresponding memory contents are shown in Table II.

TABLE II

| Index | Character | D | R | P | New Entry | String Represented |
|-------|-----------|---|---|---|-----------|--------------------|
| 1 | a | 4 | | | 0 | a |
| 2 | b | 5 | | | 0 | b |
| 3 | c | 6 | | | 0 | c |
| 4 | b | 7 | | 1 | 0 | ab |
| 5 | c | | | 2 | 0 | bc |
| 6 | a | | | 3 | 0 | ca |
| 7 | a | | n | 4 | 0 | aba |
| 8 | c | | | 4 | 0 | abc |
| n | b | | 8 | 4 | 1 | abb |

It will be seen that Table II corresponds to Table I(f) but with the addition of the sequence abb at dictionary entry n. In order to insert this sequence in the search tree, the link between nodes 7 and 8 is broken, and the new node connected between these, as shown in Table II and FIG. 6. The new right hand linking pointers R having the values n and 8 are shown underlined in FIG. 6, together with the new symbol b (also underlined). The change to the search tree illustrated conceptually in FIG. 6 is actually performed by changing the value of the R pointer at dictionary entry 7 in Table II from 8 to n and by inserting new R and P pointers 8 and 4 at dictionary entry n.

The updating algorithm is shown formally in the flow diagram of FIG. 7. This applies to both the encoder and decoder. Firstly, it is determined whether the dictionary is full in step i. If the dictionary is full, the search tree must be pruned and this procedure is described below with reference to FIG. 9. However, assuming that this is not the case, a blank memory slot is obtained from the free list (shown in FIG. 2(b)) in step ii. The new symbol (b in the case of Table II) is then written into the memory slot (n in the case of Table II) and the necessary pointers (R at dictionary entry 7 in the case of Table II) are re-set in step iii. In step iv the parent node of the new entry is examined to see if it has any existing dependants. If there are existing dependants, then in step v the new entry is inserted into the dependant list as in the example above. If there are no existing dependants, then in step vi the new entry is connected to the parent node, setting the D pointer of the parent to the memory reference of the new entry, and the P pointer of the new entry to the memory reference of the parent node.

Figure 8A:
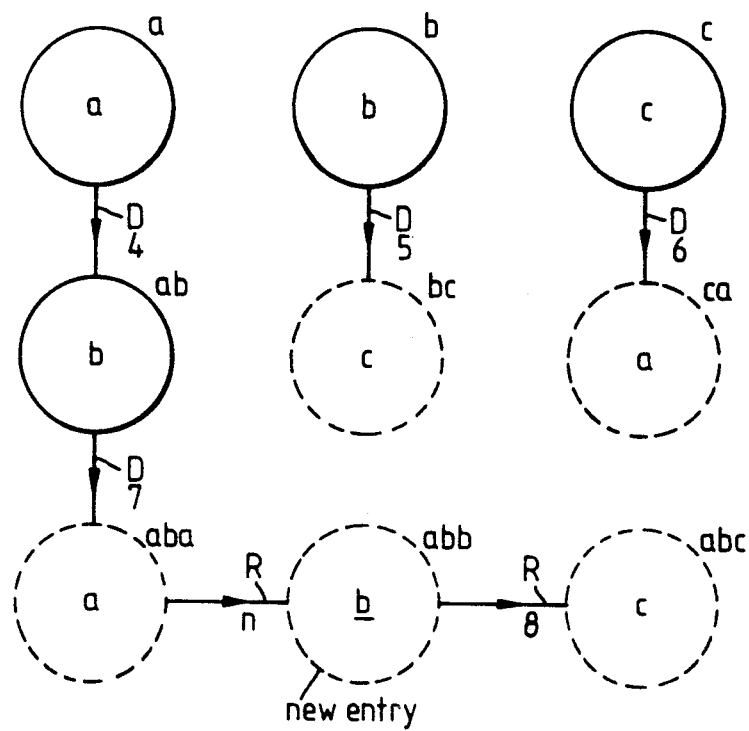
FIG. 8a shows the state of the search tree of FIG. 3f following a pruning process.

Referring first to FIG. 8, FIG. 8(a) shows the state of the search tree following the updating procedure illustrated in Table II and FIG. 6. Those symbols of the search tree which do not have D linking pointers extending downwardly from (and which therefore occur at the end of matched symbol sequences) are considered to be unlikely to be useful if the search tree is not growing at those points. Such "dead leaves" of the search tree are illustrated in FIG. 8(a) in dashed lines and the new entry b which was added in the updating procedure illustrated in FIG. 6 is marked as such in order to indicate that it is a "new leaf" from which further growth of the search tree might be expected.

Accordingly it is protected from pruning. It is envisaged that other leaves of the tree which were added in previous recent iterations might also be protected.

Figure 8B:
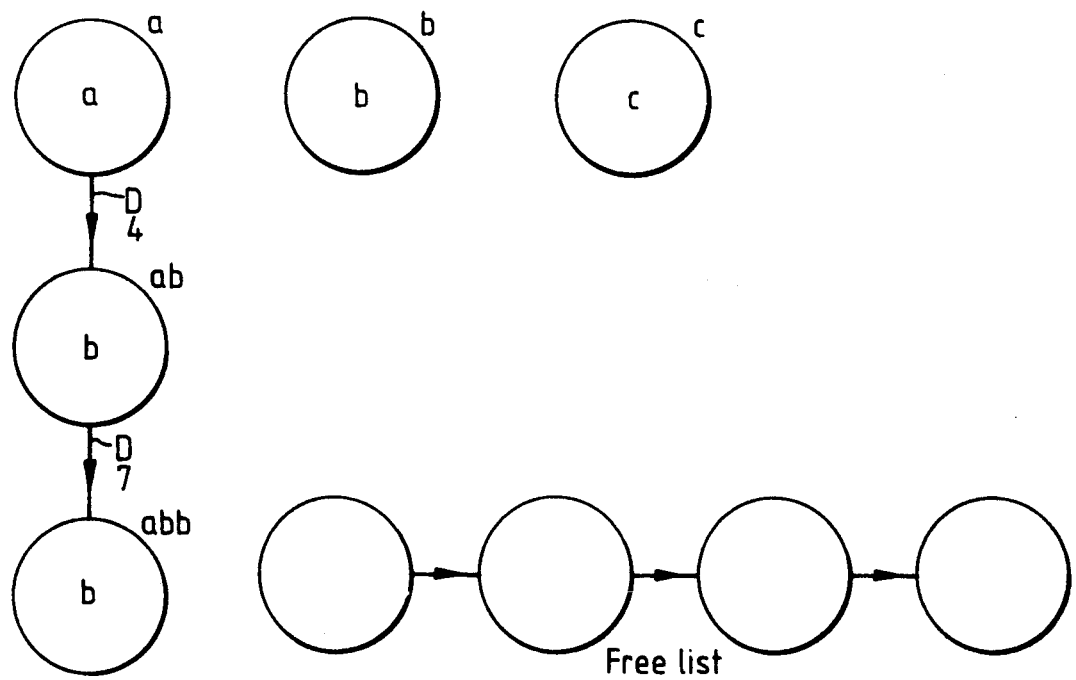
FIG. 8b shows the resulting search tree and its associated list of four pruned symbols.

The symbols of the search tree shown in dashed lines in FIG. 8(a) are pruned, resulting in the new search tree of FIG. 8(b) and a free list of four pruned symbols. The new entry b is preserved. For the sake of clarity, the actual symbol sequences corresponding to the various symbols of the search tree are indicated in FIG. 8b and it will be seen that the symbol sequences bc, ca, aba, and abc have been deleted whereas the symbol sequence abb which was added in the updating procedure of FIG. 6 has been preserved.

Figure 9:
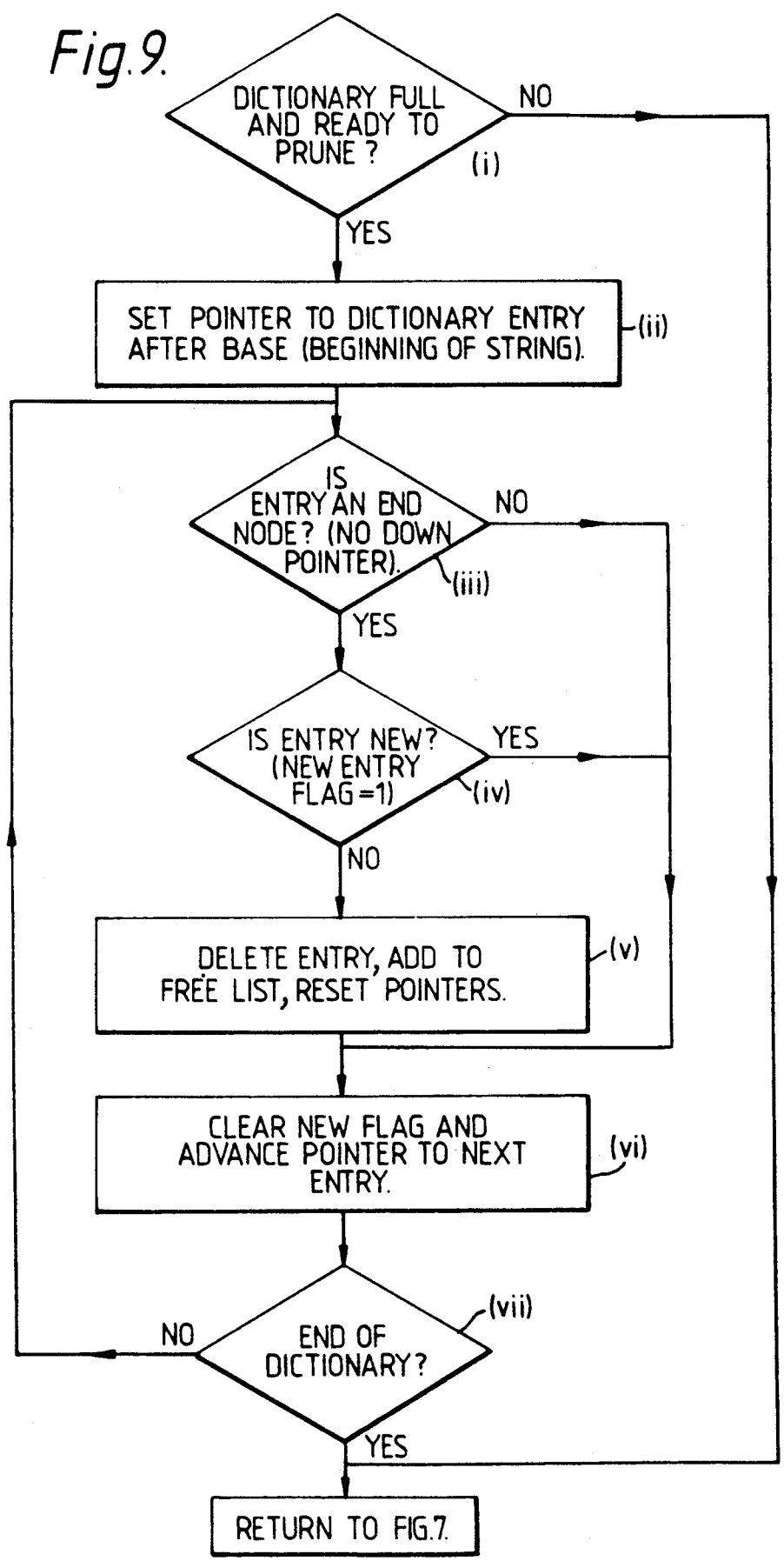
FIG. 9 is a flow diagram of an algorithm for pruning the dictionary of the invention.

The pruning procedure is shown formally in FIG. 9. In step i it is checked whether the dictionary is full and ready to prune, and if so the pointer of the memory is set to the dictionary entry following the beginning of the string, namely entry 4 corresponding to symbol b Table II and FIG. 8(a). In step iii it is determined whether this entry has a down pointer extending therefrom and in the case of FIG. 8(a) it will be seen that symbol b has the down pointer 7. Accordingly this entry is not an end node and the algorithm proceeds to advance the pointer to the next entry in step vi (which also clears any new flag) and hence via step vii to the next entry, namely symbol a of the sequence aba which is an end node. Accordingly the algorithm then checks whether this is protected against pruning by a new entry flag and since it is not it deletes the entry in step v, adds the corresponding memory location to the free list and re-sets the pointers. The re-setting of the pointers can easily be deduced from FIG. 8 by analogy with Table II and FIG. 6.

This procedure eventually results in the deletion of all "end nodes" (i.e. those having no down pointers D extending from them to other symbols) other than those protected by a new entry flag. This completes the updating of the dictionary and the algorithm can then proceed to step vi of FIG. 4 in the case of the encoding algorithm and step ii of FIG. 5 in the case of the decoding algorithm. It is emphasised that the updating and pruning of the dictionary takes place identically in the search tree of both the encoder and decoder. Whereas this pruning procedure tests all memory locations of the dictionary in a single procedure, pruning may be done in stages which can be determined in a number of ways, e.g. number of memory locations per stage, number of freed memory locations per stage.

As an additional procedure, which may improve the performance of the compression algorithm at the expense of increased memory and processing requirement, the codewords output from the encoder may be assigned lengths which depend in some manner on the frequency with which they are used. Two methods are described below for accomplishing this, which would apply to the element shown in FIG. 4 (iii) which generates codewords representing the dictionary index to be transmitted.

The first method relies on the well known prior art described in "A Method for the Construction of Minimum Redundancy Codes" by D A Huffman, Proc IRE Vol 40,9, 1952 and in "A Mathematical Theory of Communication" by C E Shannon, Bell Systems Technical Journal, Vol 27, 1948, and in "An Introduction to Arithmetic Coding" by G Langdon, IBM Journal of Research and Development, Vol 28,2, 1984. A frequency count is associated with each dictionary entry, and is incremented each time the entry is used. This frequency is used to compute the probability of occurence of the string represented by the dictionary entry, and the codeword assigned according to the procedures defined in the prior art. The codeword length Ls associated with a string of probability Ps is $$-\log_2(Ps) < Ls < 1 - \log_2(Ps)$$

The second method would in general be less effective than the first method, but is simpler to implement. An additional U pointer is associated with each dictionary entry, and is used to form a linked (least frequently used) LFU list of dictionary entries, not related to the structure of the search tree. This list is used to determine in an approximate fashion, the frequency order of the strings. Also associated with each dictionary entry is a length index.

When a dictionary entry is used it is moved up the LFU list, by using the U pointer to locate the dictionary entry above the current entry, and exchanging the U pointers and length indices of the two entries. Thus more frequently used entries will move towards the start of the LFU list. The length index will be associated with the order of elements in the list, i.e. the most frequently used dictionary entry will have a length index of 1. A code may be generated on a fixed or dynamic basis, and codewords assigned on the basis of length index, shorter codewords being assigned to dictionary entries with a low length index. This second method would be suitable for application to the compression algorithm described by Miller and Wegman in EPA 127 815, as they provide a similar list; it would be necessary to add a length index to their data structure however.

Instead of using the U pointer to exchange the currently used dictionary entry with the entry immediately above it in the linked list, an alternative procedure would be to move the currently used dictionary entry to the top position in the linked list, the entry previously in the top position being moved to the second position and so on. The linked list is now approximately representative of a Least Recently Used function whereby entries that have not been used for some time will be pushed down to the bottom of the list, and frequently used entries will reside in the top portion of the list.

As an additional procedure which may improve the performance of the encoder at the expense of additional initialisation time, the dictionary may initially contain certain strings known to occur regularly, for example 'th', 'tha', 'the', 'Th', 'The', . . .

As an additional procedure which is possible if the memory in which the dictionary is stored is capable of retaining information between the transmission of subsequent messages, as is commonly the case when a mass storage device is present or when the memory is non-volatile, the dictionary may initially contain the set of strings learnt during encoding/decoding of the previous message. As an example, a communication device may call a second communications device, which it may have previously communicated with. The respective encoder and decoder pairs may compare their dictionaries by generating some simple checksum, according to principles well known, and comparing said checksums. If the dictionaries are not equivalent they may be reset to some known initial state.

As an additional procedure which will improve the reliability of the algorithm in the presence of errors on the link between encoder and decoder, although these would normally be infrequent due to the common use of error detection procedures such as Automatic Repeat Request, the decoder may regard received codewords corresponding to empty or full dictionary entries as indication of error and request the encoder to reset or reinitialise its dictionary. Alternatively, a checksum may periodically be calculated by the encoder and communicated to the decoder; the decoder calculating an equivalent function and comparing it to the received checksum.

Figure 10:
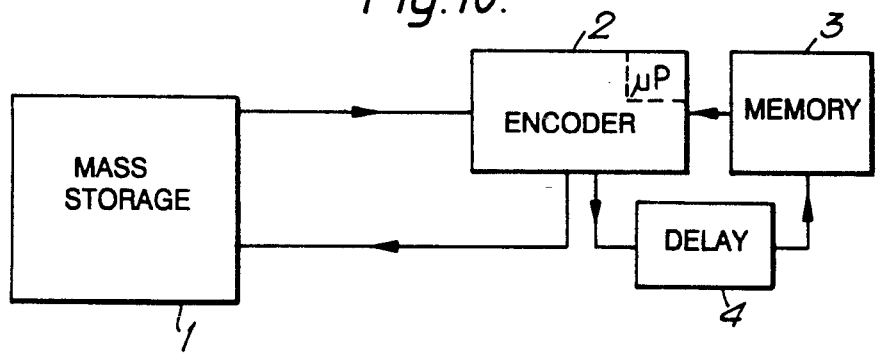
FIG. 10 is a schematic diagram of a data processing system utilising an encoder in accordance with the present invention.

FIG. 10 shows a data processing arrangement for converting uncompressed stored data which is stored in a mass storage device 1 (e.g. a disc store) into corresponding compressed data, thereby releasing memory from the mass storage device. An encoder 2 incorporating a microprocessor $\mu P$ is provided with a memory 3 in which is stored and generated a search tree by means of an algorithm as described above. A delay circuit 4 ensures that the dictionary is updated before a new symbol is received from the mass storage device.

Figure 11:
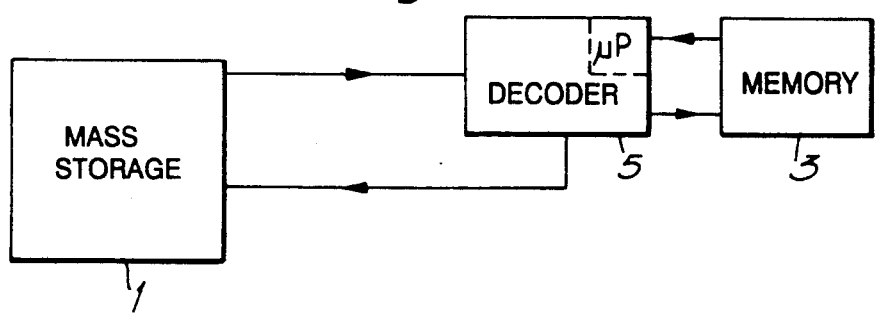
FIG. 11 is a schematic diagram of a data processing system utilising a decoder in accordance with the present invention.

FIG. 11 shows a decoder arrangement for converting compressed data in the mass storage device 1 to uncompressed data and comprises a decoder 5 provided with a memory 3 in which a search tree is maintained and updated in accordance with the algorithms described above.

Figure 12:
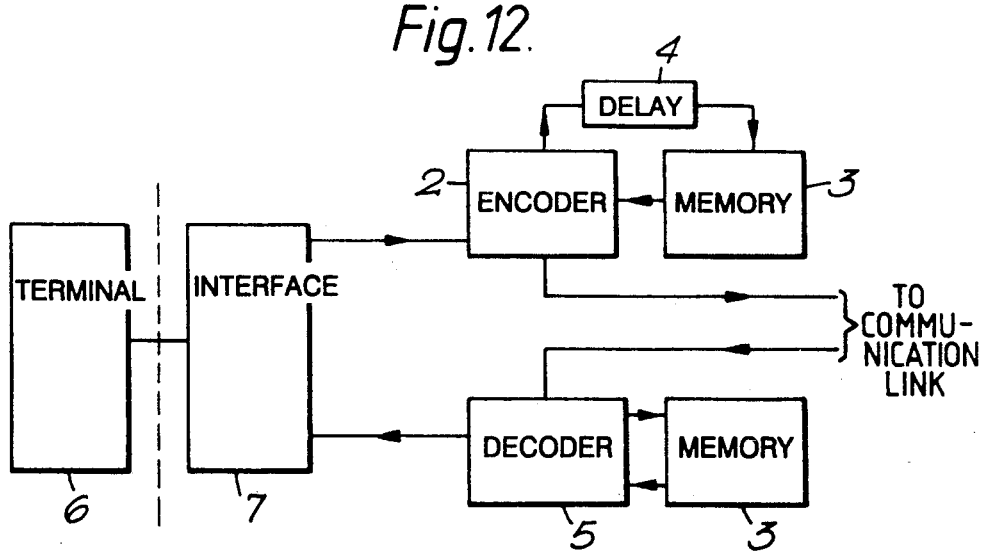
FIG. 12 is a schematic diagram of part of a communications system incorporating an encoder and decoder in accordance with the present invention.

FIG. 12 shows a terminal 6 provided with a terminal interface 7 which is arranged to transmit and receive data along a communications link by means of an encoder 2 provided with a memory 3 and delay device 4 and a decoder 5 provided with a memory 3. A dictionary is maintained in memory 3 of the encoder and decoder by means of the algorithms described above. The arrangement shown in FIG. 12 can communicate with a corresponding arrangement connected to the other end of the communication link (not shown).

In designing source encoders, it is usually assumed that the input to the encoder consists of discrete symbols from the source alphabet, and hence that the symbol size is known. Many modern communication systems employ synchronous transmission, in which data is treated as a continuous bit stream rather than individual characters.

When designing a source encoder for a synchronous source which outputs non-binary symbols in binary form, several approaches may be taken. If the symbol size is constant but unknown, the character length that results in optimum source code performance can be found by search. For example, a sample of data can be taken, the assumed character size stepped from one to some maximum number of bits, and the information content estimated for each case; the ratio of information content to character size should be minimal for the best compression ratio to be achieved. The probability of occurence $P_j$ of each symbol j is estimated and said number of bits per sequence n is varied so as to increase the information content $$\sum_{j=1}^{2^n} P_j \log_2(1/P_j)$$

of the symbols.

An alternative approach is possible if a string encoding is used. A symbol size is selected arbitrarily, the assumption being that frequent strings of source symbols will not lose their identity when parsed into bit strings of different lengths. There are various points to consider when selecting the segment size (where a segment is an assumed symbol).

For a segment of length C, as there is no synchronisation between the position in the source bit stream of segments and of symbols, any regular string of symbols may coincide with any of the C bit positions in the segment. This implies that, for any frequent string of symbols, at least C variations of the string are possible, and hence short segments are likely to result in more economical use of the dictionary space.

As the encoded binary string length is proportional to the segment size, but the codeword length is proportional to the logarithm of the number of known strings, short segments will make less efficient use of the dictionary space than long segments. This is particularly relevant to the Ziv-Lempel algorithm, in which a large proportion of the memory space is devoted to pointers rather than symbol storage.

Accordingly, in a preferred method in accordance with the invention wherein the input data consists of a stream of binary digits (bits) representing characters, and the symbols stored in the search tree are each made up of sequences of binary digits (bits), the number of bits per sequence is selected by the processor (which may be in response to an external command signal from a user), the number of bits per symbol of the input data either being unknown or being different from the number of bits per sequence selected by the processor.

In a variant of this method the number of bits per sequence is initially varied and the resulting compression ratio between the input data and the output data is monitored before selecting the number of bits per sequence for the stored symbols of the search tree.

Thus it is possible to optimise the number of bits per sequence selected by the processor in order to maximise the compression ratio. However, other factors such as memory capacity or processing speed may affect the optimum number of bits per sequence to be selected by the processor.

The above described embodiments employ a method of deletion which is highly efficient in terms of memory utilization and execution speed although it is slightly sub-optimal in terms of compression efficiency. The embodiments are formed from the two data structures used to build a dictionary, the systematic search tree structure used to represent strings and the systematic tabular representation of the dictionary used to store the elements of the search tree (as discussed by Sussenguth), the order in which elements of the search tree are stored being effectively random. The method approximates to the Random deletion strategy, in the sense that the selection of portions of the search tree to be deleted does not depend on the ordering of the selected portions within the tree, however it is not truly random as the algorithm for selecting candidates for deletion involves stepping through the tabular representation of the dictionary. This has some similarity with the CLOCK approximation, however it differs in that the selection of candidate elements for deletion made on the basis of position in the tabular representation is qualified by the position of the element within the search tree.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

I claim:

1. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries.

2. A method as claimed in claim 1 wherein all the indexed memory locations forming the dictionary are tested before the next symbol to be stored is stored in a freed memory location.

3. A method as claimed in claim 1 wherein those indexed memory locations which do not contain nodes of the search tree are linked by pointers to form a free list and nodes of the search tree are deleted by re-setting points to bypass the deleted nodes and connecting them to the free list, whereby the search tree is maintained as a connected whole.

4. A method as claimed in claim 1 wherein the input data consists of a stream of binary digits representing characters, and the symbols stored in the search tree are each made up of sequences of binary digits, and wherein the number of bits per sequence is selected by the processor, the number of bits per character of the input data either being unknown or being different from the number of bits per sequence selected by the processor.

5. A method as claimed in claim 1 wherein each linking pointer of the second type points to a first stored symbol of an ordered list of alternative stored symbols of the search tree and successive stored symbols in said ordered list are connected by linking pointers of the first type which point to each succeeding stored symbol in said list.

6. A method as claimed in claim 5 wherein linking pointers of the first type are used to search through the list of alternative stored symbols to find a match for the most recently read input symbol and, if a match is found, to obtain the pointer of the second type, if present.

7. A method as claimed in claim 1 wherein each linking pointer of the second type points to any one of a list of alternative stored symbols of the search tree, the stored symbols in said list being connected to each other by pointers of the first type pointing in one direction and also by pointers of the first type pointing in the opposite direction so as to enable any stored symbol in the list to be accessed.

8. A method as claimed in claim 1 wherein, before the input data is processed, the memory is initially provided with stored symbols each of which corresponds to a sequence of symbols likely to occur in the input data, said initially provided stored symbols being stored as nodes in the search tree.

9. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries modified by the proviso that recently created nodes of the search tree are protected against deletion.

10. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein each node of the search tree is associated with a respective counter which is incremented each time the associated node is used, and the compressed output data comprises codewords whose lengths are related to the contents of the counters such that the shortest codewords represent the most frequently used nodes.

11. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein the nodes of the search tree are stored in order in the memory and the order in which they are stored is rearranged by raising the ordinal value of a node after it has been used whereby rarely used nodes acquire a low ordinary value, and are deleted.

12. A method as claimed in claim 11 wherein the ordinal value of the used node is increased by one, and the ordinal value of the node immediately above the used node is decreased by one, whereby these two nodes exchange ordinal values.

13. A method as claimed in claim 11 wherein the ordinal value of the used node is increased to the maximum value, and the ordinal values of all the nodes above the used node are decreased by one.

14. A method as claimed in claim 11 wherein each node of the search tree has an associated length index and the compressed output data comprises codewords whose lengths are related to the length indices such that the shortest codewords represent nodes with highest ordinal values.

15. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein the input data includes spaces between sequences of symbols and the process of generating a new stored path of the search tree is terminated when such a space is detected.

16. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein the input data consists of a stream of binary digits representing characters, and the symbols stored in the search tree are each made up of sequences of binary digits, and wherein the number of bits per sequence is selected by the processor, the number of bits per character of the input data either being unknown or being different from the number of bits per sequence selected by the processor and wherein the processor is arranged to perform the selection in response to an external command signal from a user.

17. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein the input data consists of a stream of binary digits representing characters, and the symbols stored in the search tree are each made up of sequences of binary digits, and wherein the number of bits per sequence is selected by the processor, the number of bits per character of the input data either being unknown or being different from the number of bits per sequence selected by the processor and wherein the number of bits per sequence is initially varied and the resulting compression ratio between the input data and the output data is measured, and the number of bits per sequence for the stored symbols of the search tree is selected on the basis of the measured compression ratio.

18. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein the dictionary is reinitialised in response to a command signal received, in use, from an associated decoder.

19. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein, in use, a checksum for the dictionary is periodically calculated and a corresponding output signal generated.

20. A method of compressing input data comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries wherein the dictionary is retained for further use, and including performing a checksum calculation on the dictionary prior to any such further use, receiving a corresponding checksum from another such dictionary, comparing the checksums and reinitalising the dictionary if the checksums are not identical.

21. A method of storing data comprising compressing the data by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries, and storing the compressed data in a mass storage medium.

22. A method of decoding compressed data which has been compressed by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries, reading successive characters of the compressed data with a processor provided with a memory, storing in the memory a dictionary in the form of a search tree of symbols which is built up from the compressed data, and utilising the search tree to translate the compressed data to decoded data, stored symbol in the search tree being linked by linking pointers of two distinct types; a point of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols, determining when the memory is full, testing and deleting sequential indexed memory locations of the search tree if they contain a node of the search tree which does not have a linking pointer of the second type pointing to another node whereby the resulting freed memory locations are made available for new dictionary entries.

23. A method as claimed in claim 22 wherein all the indexed memory locations forming the dictionary are tested before the next symbol to be stored is stored in a freed memory location.

24. A method as claimed in claim 22 wherein those indexed memory locations which do not contain nodes of the search tree are linked by pointers to form a free list and nodes of the search tree are deleted by re-setting pointers to bypass the deleted nodes and connecting them to the free list, whereby the search tree is maintained as a connected whole.

25. A method as claimed in claim 22 wherein each linking pointer of the second type points to a first stored symbol of an ordered list of alternative stored symbols of the search tree and successive stored symbols in said ordered list are connected by linking pointers of the first type which point to each succeeding stored symbol in said list.

26. A method as claimed in claim 22 wherein each linking pointer of the second type points to any one of a list of alternative stored symbols of the search tree, the stored symbols in said list being connected to each other by pointers of the first type pointing in one direction and also by pointers of the first type pointing in the opposite direction so as to enable any stored symbol in the list to be accessed.

27. A method of decoding compressed data which has been compressed by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries comprising reading successive characters of the compressed data with a processor provided with a memory, storing in the memory a dictionary in the form of a search tree of symbols which is built up from the compressed data, and utilising the search tree to translate the compressed data to decoded data, stored symbol in the search tree being linked by linking pointers of two distinct types; a point of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols, determining when the memory is full, testing and deleting sequential indexed memory locations of the search tree if they contain a node of the search tree which does not have a linking pointer of the second type pointing to another node whereby the resulting freed memory locations are made available for new dictionary entries modified by the proviso that recently created nodes of the search tree are protected against deletion.

28. A method of decoding compressed data which has been compressed by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries comprising reading successive characters of the compressed data with a processor provided with a memory, storing in the memory a dictionary in the form of a search tree of symbols which is built up from the compressed data, and utilising the search tree to translate the compressed data to decoded data, stored symbol in the search tree being linked by linking pointers of two distinct types; a point of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols, determining when the memory is full, testing and deleting sequential indexed memory locations of the search tree if they contain a node of the search tree which does not have a linking pointer of the second type pointing to another node whereby the resulting freed memory locations are made available for new dictionary entries wherein each node of the search tree is associated with a respective counter which is incremented each time the associated node is used, the shortest codewords are allocated to the most frequently used nodes, and the compressed data to be decoded comprises codewords of which the shortest codewords represent the most frequently used nodes of the search tree of a corresponding encoder.

29. A method of decoding compressed data which has been compressed by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries comprising reading successive characters of the compressed data with a processor provided with a memory, storing in the memory a dictionary in the form of a search tree of symbols which is built up from the compressed data, and utilising the search tree to translate the compressed data to decoded data, stored symbol in the search tree being linked by linking pointers of two distinct types; a point of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols, determining when the memory is full, testing and deleting sequential indexed memory locations of the search tree if they contain a node of the search tree which does not have a linking pointer of the second type pointing to another node whereby the resulting freed memory locations are made available for new dictionary entries wherein the nodes of the search tree are stored in order in the memory and the order in which they are stored is re-arranged by raising the ordinal value of a node after it has been used whereby rarely used nodes acquire a low ordinary value, and are deleted.

30. A method as claimed in claim 29 wherein each node of the search tree has an associated length index such that the shortest codewords represent nodes with the highest ordinal values and the compressed data to be decoded comprisee codewords whose lengths are related to the length indices such that the shortest codewords represent highest ordinal value nodes of the search tree of a corresponding encoder.

31. A method as claimed in claim 29 wherein the ordinal value of the used node is increased by one, and the ordinal value of the node immediately above the used node is decreased by one, whereby these two nodes exchange ordinal values.

32. A method as claimed in claim 29 wherein the ordinal value of the used node is increased to the maximum value, and the ordinal values of all the nodes above the used code are decreased by one.

33. A method of decoding compressed data which has been compressed by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries comprising reading successive characters of the compressed data with a processor provided with a memory, storing in the memory a dictionary in the form of a search tree of symbols which is built up from the compressed data, and utilising the search tree to translate the compressed data to decoded data, stored symbol in the search tree being linked by linking pointers of two distinct types; a point of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols, determining when the memory is full, testing and deleting sequential indexed memory locations of the search tree if they contain a node of the search tree which does not have a linking pointer of the second type pointing to another node whereby the resulting freed memory locations are made available for new dictionary entries including detecting when received compressed data corresponds to empty or free memory locations and generating a corresponding output signal.

34. A method of decoding compressed data which has been compressed by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries comprising reading successive characters of the compressed data with a processor provided with a memory, storing in the memory a dictionary in the form of a search tree of symbols which is built up from the compressed data, and utilising the search tree to translate the compressed data to decoded data, stored symbol in the search tree being linked by linking pointers of two distinct types; a point of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols; determining when the memory is full, testing and deleting sequential indexed memory locations of the search tree if they contain a node of the search tree which does not have a linking pointer of the second type pointing to another node whereby the resulting freed memory locations are made available for new dictionary entries wherein the dictionary is retained for further use, and including performing a checksum calculation on the dictionary prior to any such further use, receiving a corresponding checksum from another such dictionary, comparing the checksums and reinitialising the dictionary if the checksums are not identical.

35. A method of transmitting data comprising encoding the data by a method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries, transmitting the resulting compressed data to a remote location, and decoding the compressed data by a corresponding method comprising reading successive symbols of the data with a processor provided with a memory having indexed memory locations, generating from strings of symbols in the input data a dictionary in the form of a search tree of symbols in the memory, which search tree has paths representative of said strings, matching symbol strings in the input data with previously stored paths in the search tree and generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence, determining when the memory is full, testing and deleting sequential indexed memory locations of the search tree if they contain a node of the search tree which does not have a linking pointer of the second type pointing to another node whereby the resulting freed memory locations are made available for new dictionary entries comprising reading successive characters of the compressed data with a processor provided with a memory, storing in the memory a dictionary in the form of a search tree of symbols which is built up from the compressed data, and utilising the search tree to translate the compressed data to decoded data, stored symbol in the search tree being linked by linking pointers of two distinct types; a point of the first type between stored symbols indicating that those symbols are associated with different decoded strings of symbols having the same number of symbols and the same prefix and are the respective last symbols of such different strings and a pointer of the second type between stored symbols indicating that those symbols are successive symbols in a string of decoded output symbols, determining when the memory is full, testing and deleting sequential indexed memory locations of the search tree if they contain a node of the search tree which does not have a linking pointer of the second type pointing to another node whereby the resulting freed memory locations are made available for new dictionary entries.

36. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries.

37. An encoder as claimed in claim 36 wherein the processor is further arranged to test all the indexed memory locations forming the dictionary before the next symbol to be stored is stored in a freed memory location.

38. An encoder as claimed in claim 36 wherein each linking pointer of the second type points to a first stored symbol of an ordered list of alternative stored symbols of the search tree and successive stored symbols in said ordered list are connected by linking pointers of the first type which point to each succeeding stored symbol in said list.

39. An encoder as claimed in claim 36 wherein the processor is arranged to link by pointers those indexed memory locations which do not contain nodes of the search tree to form a free list and to delete nodes of the search tree by re-setting pointers to bypass the deleted nodes and connecting them to a free list, whereby the search tree is maintained as a connected whole.

40. An encoder as claimed in claim 36 for encoding input data consisting of a stream of binary digits representing characters, wherein the symbols stored in the search tree are each made up of sequences of binary digits, and wherein the processor is arranged to select the number of bits per sequence such as to be different from the number of bits per character of the input data, if known.

41. An encoder as claimed in claim 40 wherein the number of bits per sequence selected by the processor is initially varied and the resulting compression ratio between the input data and the output data is measured, and the number of bits per sequence for the stored symbols of the search tree is selected on the basis of the measured compression ratio.

42. An encoder as claimed in claim 36 wherein each linking pointer of the second type points to any one of a list of alternative stored symbols of the search tree, the stored symbols in said list being connected to each other by pointers of the first type pointing in one direction and also by pointers of the first type pointing in the opposite direction so as to enable any stored symbol in the list to be accessed.

43. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein the process is arranged to protect recently created nodes of the search tree against deletion.

44. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein each node of the search tree is associated with a respective counter which is incremented each time the associated node is used, and the processor is arranged to provide compressed output data comprising codewords whose lengths are related to the contents of the counters such that the shortest codewords represent the most frequently used nodes.

45. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein the nodes of the search tree are stored in order in the memory and the processor is arranged to re-arrange the order in which they are stored by raising the ordinal value of a node after it has been used whereby rarely used nodes acquire a low ordinal value, and to delete nodes having the lowest ordinal values.

46. An encoder as claimed in claim 45 wherein the ordinal value of the used node is increased by one, and the ordinal value of the node immediately above the used node is decreased by one, whereby these two nodes exchange ordinal values.

47. An encoder as claimed in claim 45 wherein the ordinal value of the used node is increased to the maximum value, and the ordinal values of all the nodes above the used node are decreased by one.

48. An encoder as claimed in claims 45, 46 or 47 wherein each node of the search tree has an associated length index and the processor is arranged to provide compressed output data comprising codewords whose lengths are related to the length indices such that the shortest codewords represent nodes with the highest ordinal values.

49. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and for encoding input data including spaces between sequences of symbols and wherein the processor is arranged to terminate the process of generating a new stored path of the search tree when such a space is detected.

50. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein the input data is of a stream of binary digits representing characters, wherein the symbols stored in the search tree are each made up of sequences of binary digits, and wherein the processor is arranged to select the number of bits per sequence such as to be different from the number of bits per character of the input data, if known and wherein the processor is arranged to perform the selection in response to an external command signal from a user.

51. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein, in use, the processor is responsive to a command signal received from an associated decoder to reinitialise its dictionary.

52. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein, in use, the processor periodically calculates a checksum for the dictionary and generates a corresponding output signal.

53. An encoder for compressing input data comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein the dictionary is retained for further use and the processor is arranged to perform a checksum calculation on the dictionary prior to any such further use and to generate a corresponding output signal, to compare this checksum with a corresponding checksum received, in use, from an associated decoder, and to reinitialise the dictionary to an initial state if the checksums are not identical.

54. A decoder for decoding compressed data comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries.

55. A decoder as claimed in claim 54 wherein in use, each linking pointer of the second type points to a first stored symbol of an ordered list of alternative stored symbols of the search tree and successive stored symbols in said ordered list are connected by linking pointers of the first type which point to each succeeding stored symbol in said list.

56. A decoder as claimed in claim 54 wherein in use, each linking pointer of the second type points to any one of a list of alternative stored symbols of the search tree, the stored symbols in said list being connected to each other by pointers of the first type pointing in one direction and also by pointers of the first type pointing in the opposite direction so as to enable any stored symbol in the list to be accessed.

57. A decoder as claimed in claim 54 wherein the processor is further arranged to test all the indexed memory locations forming the dictionary before the next symbol to be stored is stored in a freed memory location.

58. A decoder as claimed in claim 54 wherein the processor is arranged to link by pointers those indexed memory locations which do not contain nodes of the search tree link by pointers to form a free list and to delete nodes of the search tree by re-setting pointers to bypass the deleted nodes and connecting them to the free list, whereby the search tree is maintained as a connected whole.

59. A decoder for decoding compressed data comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein the processor is arranged to protect recently created nodes of the search tree against deletion.

60. A decoder for decoding compressed data comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein each node of the search tree is associated with a respective counter which is associated with a respective counter which is incremented each time the associated node is used, and the processor is arranged to provide compressed output data comprising codewords whose lengths are related to the contents of the counters such that the shortest codewords represent the most frequently used nodes.

61. A decoder for decoding compressed data comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein the nodes of the search tree are stored in order in the memory and the processor is arranged to re-arrange the order in which they are stored by raising the ordinal value of a node after it has been used whereby rarely used nodes acquire a low ordinal value, and to delete nodes having the lowest ordinal value.

62. A decoder as claimed in claim 61 wherein the ordinal value of the used node is increased by one, and the ordinal value of the node immediately above the used node is decreased by one, whereby these two nodes exchange ordinal values.

63. A decoder as claimed in claim 61 wherein the ordinal value of the used node is increased to the maximum value, and the ordinal values of all the nodes above the used node are decreased by one.

64. A decoder as claimed in claim 61 wherein each node of the search tree has an associated length index and the processor is arranged to provide compressed output data comprising codewords whose lengths are related to the length indices such that the shortest codewords represent nodes with the highest ordinal values.

65. A decoder for decoding compressed data comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein, in use, the processor is arranged to detect when received compressed data corresponds to empty or free memory locations and to generate a corresponding output signal for transmission to an associated encoder.

66. A decoder for decoding compressed data comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and wherein the dictionary is retained for further use and the processor is arranged to perform a checksum calculation on the dictionary prior to any such further use and to generate a corresponding output signal for transmission to an associated encoder, to compare this checksum with a corresponding checksum received, in use, from said encoder, and to reinitialise the dictionary if the checksums are not identical.

67. Data processing apparatus comprising an encoder comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries, a corresponding decoder comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and a data link for transmitting the compressed data between the encoder and decoder.

68. Data processing apparatus comprising an encoder comprising a processor capable of receiving successive symbols of input data, a memory having indexed memory locations, means for storing in the memory a search tree of symbols which has paths representative of strings of symbols in the input data, and means for matching symbol strings in the input data with previously stored paths in the search tree and for generating from the stored paths compressed output data corresponding to the input data, stored symbols in the search tree being linked to form said paths by linking pointers of two distinct types; a pointer of the first type between stored symbols indicating that those stored symbols are alternative possible symbols at a given position in an input symbol sequence and a pointer of the second type between stored symbols indicating that those stored symbols both occur, in order, in a possible input symbol sequence said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries, a corresponding decoder comprising a processor capable of receiving successive symbols of compressed data, a memory having indexed memory locations and means for storing in the memory a dictionary in the form of a search tree of symbols, the processor being arranged to build up the search tree from the compressed data and to utilise the search tree to translate the compressed data to decoded data, stored symbols in the search tree being linked by linking pointers of two distinct types; a pointer of the first type between stored symbols indicating that those symbols are associated with different decoded strings of symbols having the same number of symbols and are the respective last symbols of such different strings and a pointer of the second type between stored symbols indicating that those symbols are successive symbols in a string of decoded output symbols said processor is arranged to determine when the memory is full, to test sequential indexed memory locations of the search tree, and to delete a memory location if it contains a node of the search tree which does not have a linking pointer of the second type pointing to another node so as to make the resulting freed memory locations available for new dictionary entries and a mass storage medium accessible by the encoder and decoder.

* * * * *

(12) EX PARTE REEXAMINATION CERTIFICATE (7426th)

United States Patent
Clark

(10) Number: US 5,153,591 C1
(45) Certificate Issued: Mar. 30, 2010

(54) METHOD AND APPARATUS FOR ENCODING, DECODING AND TRANSMITTING DATA IN COMPRESSED FORM

(75) Inventor: Alan D. Clark, Ipswich (GB)

(73) Assignee: British Telecommunications Public Limited Company, London (GB)

Reexamination Request:
No. 90/010,305, Oct. 6, 2008

Reexamination Certificate for:
Patent No.: 5,153,591
Issued: Oct. 6, 1992
Appl. No.: 07/623,809
Filed: Dec. 27, 1990

(22) PCT Filed: Jul. 4, 1989

(86) PCT No.: PCT/GB89/00752
§ 371 (c)(1),
(2), (4) Date: Dec. 27, 1990

(87) PCT Pub. No.: WO90/00837
PCT Pub. Date: Jan. 25, 1990

(30) Foreign Application Priority Data

Jul. 5, 1998 (GB) ............................................. 8815978

(51) Int. Cl.
*G06T 9/00* (2006.01)
*G06F 17/30* (2006.01)
*H03M 7/30* (2006.01)

(52) U.S. Cl. ............................... 341/51; 341/67; 341/79
(58) Field of Classification Search ........................ None
See application file for complete search history.

(56) References Cited

U.S. PATENT DOCUMENTS 4,814,746 A 3/1989 Miller
4,876,541 A 10/1989 Storer
4,906,991 A 3/1990 Fiala

OTHER PUBLICATIONS

Koch, K. "Representation of Tree Data Structures for Data Manipulation and Search Operations," IBM Technical Disclosure Bulletin, vol. 14, No. 11 Apr. 1972.
Crus, R.A. et al., "Methods for Deleting Records From A Hierarchical Data," IBM Technical Disclosure Bulletin, vol. 25, No, 11B Apr. 1983.

*Primary Examiner*—Zoila E Cabrera

(57) ABSTRACT

Data compression and decompression utilizing, e.g., the Ziv-Lempel algorithm is simplified by utilizing a tree structure for the dictionary in which alternative symbols at a given position in a symbol sequence (a,b,c) are linked by linking pointers R of a first type and successive symbols (ab,bc,ca, aba,abb,abc) are linked by linking pointers D of a second type. For example, the sequence ab may continue with any one of the symbols a,b, and c grouped together by R pointers in a list below the final symbol of the sequence ab. Each symbol is defined by an associated pair of D and R pointers, in conjunction with a parent pointer P which identifies its parent. Symbols having no D pointers extending therefrom are pruned from the tree and transferred to a free list as shown in FIG. 8(b).

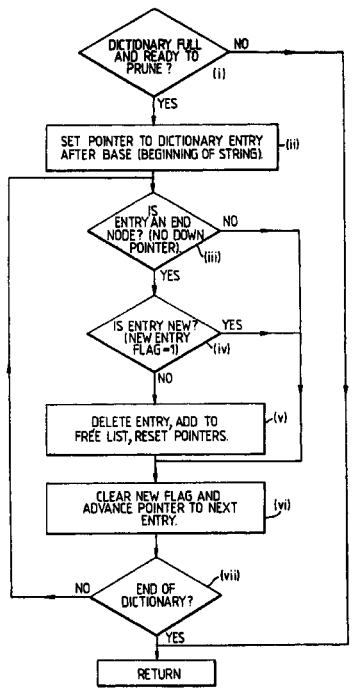

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–5, 7–8, 36–40 and 42 is confirmed.

Claims 6, 9–35, 41 and 43–68 were not reexamined.

* * * * *